United States Patent [19]

Satoh

[11] 4,077,014
[45] Feb. 28, 1978

[54] AUTOMATIC GAIN CONTROL CIRCUIT

[75] Inventor: Ken Satoh, Hachioji, Japan

[73] Assignee: Olympus Optical Co., Ltd., Tokyo, Japan

[21] Appl. No.: 731,429

[22] Filed: Oct. 12, 1976

[30] Foreign Application Priority Data

Oct. 15, 1975 Japan .............................. 50-140493[U]

[51] Int. Cl.² .............................................. H03G 3/30
[52] U.S. Cl. ..................................... 330/278; 330/277; 330/145
[58] Field of Search ............................ 330/29, 35, 145

[56] References Cited

U.S. PATENT DOCUMENTS 3,480,873  11/1969  Carter ................................. 330/35 X
3,668,542  6/1972  Stoffer ............................... 330/29 X Primary Examiner—Lawrence J. Dahl
Attorney, Agent, or Firm—Ostrolenk, Faber, Gerb & Soffen

[57] ABSTRACT

An automatic gain control circuit employs a field effect transistor having a pair of gate electrodes. Distortion factor is minimized by applying a rectified and smoothed output signal to the first gate electrode and applying an input signal to the second gate electrode either directly or through a resistor.

9 Claims, 7 Drawing Figures

AUTOMATIC GAIN CONTROL CIRCUIT

BACKGROUND OF THE INVENTION

The invention relates to an automatic gain control (AGC) circuit, and more particularly, to an AGC circuit employing a field effect transistor (FET's).

AGC circuits employing FET are known, but involve the disadvantage that as the magnitude of an input signal increases, even harmonics increase to degrade the distortion factor.

By way of illustration, a conventional AGC circuit is shown in FIG. 1 wherein an N-channel FET $Q_1$ of junction type has its drain electrode D connected with an input terminal 1 and its source electrode S connected with an input terminal of an amplifier 3. A negative feedback path including a rectifier 4, and a smoothing circuit comprising a capacitor 5 and a resistor 6 is connected between an output terminal 2 of the amplifier 3 and a gate electrode G of the FET $Q_1$. FIG. 2 graphically shows the distortion characteristic (curve a) and input-output characteristic of the AGC circuit shown in FIG. 1. As will be evident, the distortion increases with an increase in the input level, due to increasing even harmonics. An increase of the distortion is attributable to a variation with time in the impedance across the drain and source of FET $Q_1$ which results from a variation in the gate potential as it is fed by the rectified output, when the input level is high to cause a large variation of a signal level with time. This is illustrated in FIGS. 3 and 4. In FIG. 3, an input signal has a high amplitude, so that the impedance across the drain and source of the field effect transistor will be high at point A and low at point B, resulting in a distorted output signal as indicated by a curve C. However, the input signal shown in FIG. 4 has a reduced amplitude, so that there is little difference in the impedance between points Ao and Bo. Hence, the distortion in the output signal will be substantially reduced.

SUMMARY OF THE INVENTION

It is an object of the invention to provide an AGC circuit employing FET having a pair of gate electrodes which eliminates the disadvantage of the prior art.

In accordance with the invention, the superimposed application of an input signal to the gate permits the voltage across the gate and the drain to be maintained constant regardless of a variation in the magnitude of the input signal with time. Since the substitution of an FET having a pair of gate electrodes for a conventionally employed FET is all that is required, no substantial complication of arrangement and increase of cost results.

DETAILED DESCRIPTION OF PREFERRED EMBODIMENT

Figure 5:
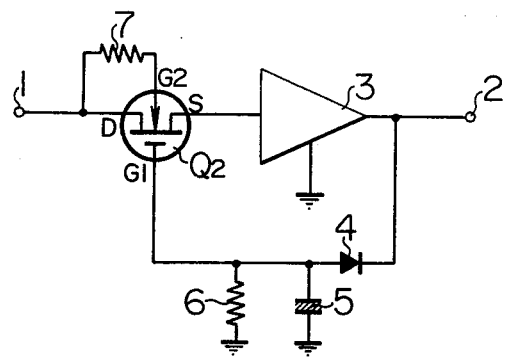
FIG. 5 is a circuit diagram of an AGC circuit according to one embodiment of the invention.

Referring to FIG. 5, the AGC circuit according to the invention comprises an FET $Q_2$ having a first and a second gate electrode $G_1$, $G_2$. In the example shown, FET $Q_2$ is an N-channel MOS field effect transistor of depletion type, and has its second gate electrode $G_2$ connected either directly or through a resistor 7 with its drain electrode D, which is in turn connected with the input terminal 1. A negative feedback path which includes the rectifier 4 and the smoothing circuit comprising the capacitor 5 and resistor 6 as before is connected between the output terminal 2 of the amplifier 3 and the first gate electrode $G_1$, and the source electrode S is connected with the input terminal of the amplifier 3 as in the conventional arrangement.

Figure 1:
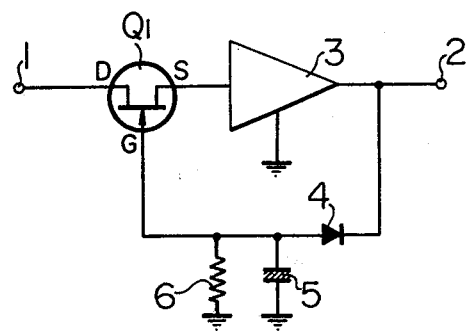
FIG. 1 is a circuit diagram of a conventional AGC circuit employing FET.
Figure 2:
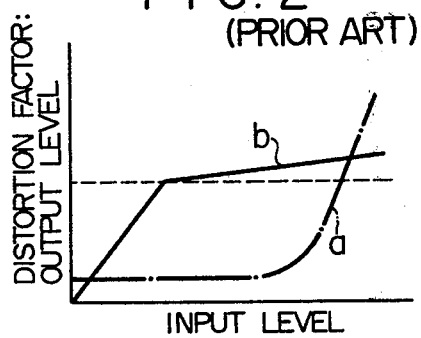
FIG. 2 graphically shows the distortion and the input-output characteristic of the AGC circuit shown in FIG. 1.
Figure 3:
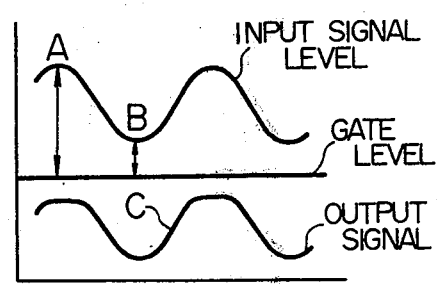
FIGS. 3 and 4 are graphical illustrations of the relationship between the input level, the gate level and the output signal.
Figure 4:
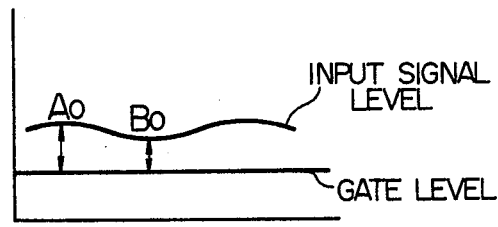
Figure 6:
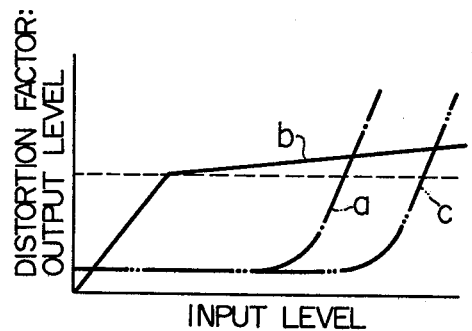
FIG. 6 graphically shows the distortion and the input-output characteristic of the AGC circuit shown in FIG. 5.
Figure 7:
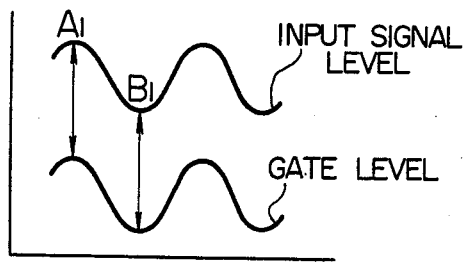
FIG. 7 is a graphical illustration of the relationship between the input level and the gate level.

When an input signal of sinusoidal waveform, for example, is applied to the input terminal 1, the arrangement of the invention maintains a constant voltage between the gate ($G_2$) and drain, as illustrated at $A_1$ and $B_1$ in FIG. 7, so that the impedance across the drain and source is maintained uniform, yielding a satisfactory output waveform in both high and low regions of the waveform. As shown in FIG. 6 in which curves $a$ and $b$ are the replica of FIG. 2, the distortion characteristic represented by a curve $c$ which is achieved with the AGC circuit of the invention minimizes distortions at higher input levels.

What is claimed is:

1. An automatic gain control circuit comprising a field effect transistor having source and drain electrodes and first and second gate electrodes;
    amplifier means having an output and an input, with the latter being coupled to one of said source and drain electrodes;
    a portion of the output from said amplifier means being coupled through polarized diode means to said first gate electrode, forming a feedback path for obtaining automatic gain control;
    an input terminal for receiving a signal to be amplified being coupled to the remaining one of said source and drain electrodes;
    means for coupling said input terminal to said second gate electrode to assist in maintaining a constant voltage between said second gate electrode and said input terminal in order to minimize distortion which might otherwise occur in the amplification of a signal applied to the input terminal.

2. An automatic gain control circuit according to claim 1 in which the transistor is a metal-oxide-semiconductor field effect transistor of depletion type.

3. An automatic gain control circuit according to claim 1 in which input signals are applied to the second gate electrode through a resistor which constitutes said means for coupling said input terminal to said second gate electrode.

4. The automatic gain control circuit of claim 1, further comprising resistance and capacitance elements coupling said feedback path to ground reference.

5. The automatic gain control circuit of claim 1, wherein the semiconductor element in said feedback path is polarized to block positive going signals developed at the output of said amplifier from being applied to the gate electrode coupled to the feedback path.

6. The automatic gain control circuit of claim 1 in which said input is coupled to said source electrode and said input terminal is coupled to said drain electrode.

7. The automatic gain control circuit of claim 6 further comprising resistance and capacitance elements coupling said feedback path to ground reference; said semiconductor element in said feedback path being polarized to block positive going signals developed at the output of said amplifier from being applied to the gate electrode coupled to the feedback path.

8. An automatic gain control circuit according to claim 7 in which input signals are applied to the second gate electrode through a resistor which constitutes said means for coupling said input terminal to said second gate electrode.

9. An automatic gain control circuit according to claim 8 in which the transistor is a metal-oxide-semiconductor field effect transistor of depletion type.

* * * * *